US008032845B2

(12) United States Patent
Kamat et al.

(10) Patent No.: US 8,032,845 B2

(45) **Date of Patent: *Oct. 4, 2011**

(54) CORRECTING 3D EFFECTS IN PHASE SHIFTING MASKS USING SUB-RESOLUTION FEATURES

(75) Inventors: Vishnu G. Kamat, Cupertino, CA (US); Armen Kroyan, San Francisco, CA (US)

(73) Assignee: Synopsys, Inc., Mountain View, CA (US)

( * ) Notice: Subject to any disclaimer, the term of this patent is extended or adjusted under 35 U.S.C. 154(b) by 291 days.

This patent is subject to a terminal disclaimer.

(21) Appl. No.: 12/360,694

(22) Filed: Jan. 27, 2009

(65) Prior Publication Data

US 2009/0136857 A1 May 28, 2009

Related U.S. Application Data

(63) Continuation of application No. 11/462,686, filed on Aug. 4, 2006, now Pat. No. 7,503,030, and a continuation of application No. 10/774,342, filed on Feb. 5, 2004, now Pat. No. 7,111,276.

(51) Int. Cl.

| | |
|---|---|
| ***G06F 17/50*** | (2006.01) |
| ***G03F 1/00*** | (2006.01) |
| ***G06K 9/00*** | (2006.01) |

(52) U.S. Cl. ................ 716/55; 716/50; 430/5; 382/144; 382/145

(58) Field of Classification Search .............. 716/50–55; 430/5; 382/144–145

See application file for complete search history.

(56) References Cited

U.S. PATENT DOCUMENTS

| | | | |
|---|---|---|---|
| 5,403,682 | A | 4/1995 | Lin |
| 6,609,245 | B2 | 8/2003 | Liebmann et al. |
| 2003/0068564 | A1 | 4/2003 | Liu et al. |
| 2003/0200524 | A1 | 10/2003 | Liebmann et al. |
| 2004/0096752 | A1 | 5/2004 | Liebmann et al. |
| 2004/0168147 | A1 | 8/2004 | Dai et al. |
| 2004/0191650 | A1 | 9/2004 | Pierrat |
| 2005/0014074 | A1 | 1/2005 | Liebmann et al. |
| 2005/0042527 | A1 | 2/2005 | Pierrat |
| 2005/0262468 | A1 | 11/2005 | Mesuda et al. |

*Primary Examiner* — Stacy Whitmore

(74) *Attorney, Agent, or Firm* — Bever, Hoffman & Harms, LLP; Jeanette S. Harms

(57) ABSTRACT

Using phase shifting on a mask can advantageously improve printed feature resolution on a wafer, thereby allowing greater feature density on an integrated circuit. Phase shifting can create an intensity imbalance between 0 degree and 180 degree phase shifters on the mask. An improved method of designing an alternating PSM to minimize this intensity imbalance is provided. Sub-resolution features, called "blockers", can be incorporated in the alternating PSM design. Specifically, blockers can be formed in the 0 degree phase shifters. In this configuration, the intensity associated with the 0 degree phase shifters approximates the intensity associated with the corresponding 180 degree phase shifters. Intensity balancing using blockers retains image contrast, thereby ensuring printed feature quality.

44 Claims, 11 Drawing Sheets

200

0 Degree Phase Shifter 203

202

180 Degree Phase Shifter 204

201

207

205

207

206

208

CORRECTING 3D EFFECTS IN PHASE SHIFTING MASKS USING SUB-RESOLUTION FEATURES

RELATED APPLICATIONS

This application is a continuation of U.S. patent application Ser. No. 11/462,686, entitled "Correcting 3D Effects In Phase Shifting Masks Using Sub-Resolution Features" filed Aug. 4, 2006 which is a continuation of U.S. patent application Ser. No. 10/774,342, entitled "Correcting 3D Effects In Phase Shifting Masks Using Sub-Resolution Features" filed Feb. 5, 2004 and issued as U.S. Pat. No. 7,111,276 on Sep. 19, 2006.

BACKGROUND OF THE INVENTION

1. Field of the Invention

This invention relates to the field of alternating phase-shifting masks, and in particular to a method of correcting three-dimensional (3D) effects in alternating phase-shifting masks using sub-resolution features.

2. Description of Related Art

To fabricate an integrated circuit (IC), a physical representation of the features of the IC, e.g. a layout, is transferred onto a plurality of masks. Note that as used herein, the term "mask" includes "reticles". The features make up the individual components of the circuit, such as gate electrodes, field oxidation regions, diffusion regions, metal interconnections, and so on. A mask is generally created for each layer of the IC. To create a mask, the data representing the layout for a corresponding IC layer can be input into a device, such as an electron beam machine, which writes IC features onto the mask. Once a mask has been created, the pattern on the mask can be transferred onto the wafer surface using a lithographic process.

Lithography is a process whose input is a mask and whose output includes the printed patterns on a wafer. As printed patterns on the IC become more complex, a need arises to decrease the feature size. However, as feature sizes shrink, the resolution limits of current optical-based lithographic systems are approached. Specifically, one type of lithographic mask includes clear regions and opaque regions, wherein the pattern of these two regions defines the features of a particular semiconductor layer. Under exposure conditions, diffraction effects at the transition of the transparent regions to the opaque regions can render these edges indistinct, thereby adversely affecting the resolution of the lithographic process.

Various techniques have been proposed to improve this resolution. One such technique, phase-shifting, uses phase destructive interference of the waves of incident light. Specifically, phase-shifting shifts the phase of a first region of incident light waves approximately 180 degrees relative to a second, adjacent region of incident light waves. In this manner, the projected images from these two regions destructively interfere where their edges overlap, thereby improving feature delineation and allowing greater feature density on the IC. A mask that uses such techniques is called a phase shifting mask (PSM).

In one type of PSM, called an alternating PSM, apertures between closely spaced features are processed so that light passing through any aperture is 180 degrees out of phase from the light passing through an adjacent aperture. FIGS. 1A and 1B illustrate one embodiment of an alternating PSM 100 including closely spaced opaque (e.g. chrome or some other absorbing material) features 101, 102, 103, and 104 formed on a transparent, e.g. quartz, substrate 105. Thus, apertures 106, 107, and 108 are formed between features 101-104.

To provide the phase shifting in this embodiment, the areas of substrate 105 under alternating apertures can be etched, thereby causing the desired 180 degree phase shift. For example, substrate 105 can be etched in the area defined by aperture 107 to a predetermined depth. In this manner, the phase shift of light passing through aperture 107 relative to light passing through apertures 106 and 108 is approximately 180 degrees.

Unfortunately, the use of an alternating PSM can introduce an intensity imbalance problem. FIG. 1C illustrates a graph 130 that plots intensity (0 to 1.0) versus position on alternating PSM 100. In graph 130, waveforms 131 that are shown nearing 1.0 intensity correspond to apertures 106 and 108, whereas waveform 132 that is shown at approximately 0.84 intensity corresponds to aperture 107. The intensity imbalance between the 180 degree phase shifting region (i.e. aperture 107) and the 0 degree phase shifting regions (i.e. apertures 106 and 108) is caused by the trench cut into substrate 105, thereby causing diffraction in the corners of aperture 107 and degrading the intensity of the corresponding waveform. This industry-recognized diffraction effect is called a three-dimensional (3D) effect.

Intensity imbalance can adversely affect printing features and overlay on the wafer. Typically, a feature on a binary mask has a pair of corresponding phase shifting regions on an alternating PSM. For example, referring to FIG. 1D, a feature 140 can have a corresponding 0 degree phase shifting region (also called a phase shifter herein) 141 placed relative to one side of feature 140 and a corresponding 180 degree phase shifter 142 placed relative to the other side of feature 140. Of interest, if phase shifters 141 and 142 are the same size, the electric field associated with phase shifter 141 is stronger than the electric field associated with phase shifter 142, thereby resulting in the maximum interference of these fields to occur to the right of centerline 143 on feature 140. Thus, under these conditions, feature 140 will actually print on the wafer to the right of the desired location as shown by dotted lines indicating the printed location of feature 150 and its associated centerline 153.

Moreover, any defocus in the system can exacerbate the 3D effect and cause significant deviation from desired feature placement on the wafer. Because any wafer production line requires at least some acceptable range of defocus, e.g. typically within 0.4 microns, feature placement is frequently adversely affected when using an alternating PSM. Therefore, those in the industry have proposed various methods to address the intensity imbalance problem.

In one proposed method shown in FIG. 1E, an additional etching step can be performed on substrate 105, thereby providing an undercut etch 160 of features 101-104. Undercut etch 160 increases the intensity by attempting to localize the diffraction effects under features 101-104. Unfortunately, under-cut etch 160 can also create mechanical instability of features 101-104 on the mask. Specifically, the greater the under-cut etch, the greater the probability of mechanical (e.g. chrome) instability during subsequent processing steps, such as mask cleaning. Thus, undercut etch 160 provides an incomplete solution with the potential of causing complete mask failure.

Another potential solution (not shown) includes biasing the size of the 180 degree phase-shifting region to be larger than the 0 degree phase-shifting region, as described in U.S. Pat. No. 6,670,082, which issued on Dec. 30, 2003 to the assignee of the present application, Numerical Technologies, Inc. This method ensures mechanical stability, but does typically require determining the appropriate bias for a plurality of 180 degree phase-shifting regions.

Another potential solution (not shown) includes providing a dual trench structure in the PSM, i.e. both the 0 degree and 180 degree phase shifters are formed using trenches. Using this structure, both phase shifters suffer from diffraction effects, which can minimize or even eliminate the undesirable intensity imbalance. Unfortunately, forming the additional trenches in the substrate adds significantly more time to the manufacturing operation, e.g. typically doubling the time, thereby undesirably increasing manufacturing cost.

Yet another potential solution (not shown) includes sloping the sidewalls of the 180 degree phase shifters and providing a layer of chrome on such sloped sidewalls, thereby minimizing diffraction effects. However, this type of mask, called sidewall chrome alternating aperture mask (SCAAM), also suffers from significantly higher manufacturing cost than the standard PSM. Moreover, as features get smaller, the appropriate angle for the sloping sidewalls can become a limiting factor. That is, the angle may result in a de facto minimum feature size.

Therefore, a need arises for a method of correcting 3D effects of phase-shifting masks while ensuring mechanical stability and manufacturing efficiency.

SUMMARY OF THE INVENTION

Using phase shifting on a mask can advantageously improve printed feature resolution on a wafer, thereby allowing greater feature density on an integrated circuit. An alternating phase shifting mask (PSM) has pairs of apertures, wherein light passing through one aperture is 180 degrees out of phase from light passing through the other aperture. For ease of reference, these apertures are called 0 degree phase shifters and 180 degree phase shifters herein. To provide the appropriate phase shift, the mask substrate is etched in the area associated with the 180 degree phase shifters. The resulting trenches in the substrate can result in an intensity imbalance between the 180 degree phase shifters and the 0 degree phase shifters.

This intensity imbalance, without correction, can undesirably change the locations of printed features on the wafer. Known solutions to this intensity imbalance problem can cause mechanical instability on the mask or decrease feature density on the integrated circuit. Therefore, an improved method of designing an alternating PSM to minimize this intensity imbalance is provided.

In accordance with one aspect of the invention, sub-resolution features, called "blockers", can be incorporated in the alternating PSM design. Specifically, blockers can be formed in the 0 degree phase shifters. In this configuration, the intensity associated with the 0 degree phase shifters approximates the intensity associated with the corresponding 180 degree phase shifters. Of importance, this intensity balancing retains image contrast, thereby ensuring printed image quality.

In one embodiment, the length of the blocker can be "grown" until the desired amount of intensity imbalance correction is achieved. Notably, the size of each blocker can be determined using a software-implementation. Thus, blocker size can be easily customized for each pair of phase shifters. This process flexibility can be used to create a uniform intensity imbalance error on the mask.

At this point, a mask-based solution can be used to correct for that uniform intensity imbalance error. Exemplary mask-based solutions include undercutting or biasing of the 180 degree phase shifters. Fortunately, the use of the blockers can significantly reduce the amount of undercutting necessary (if needed at all), thereby advantageously reducing the minimum chrome specification as well as the risk of chrome defects that could occur during the mask cleaning process.

In another embodiment, the number of the blockers within the 0 degree phase shifter can be increased until the desired amount of intensity imbalance correction is achieved. In yet another embodiment, if a 180 degree phase shifter includes a sub-resolution feature, then the blocker in the corresponding 0 degree phase shifter can be sized to be larger than the sub-resolution feature.

Thus, an alternating PSM can include a 180 degree phase shifter, a 0 degree phase shifter corresponding to the 180 degree phase shifter, and at least one sub-resolution feature formed in the 0 degree phase shifter to minimize an intensity imbalance with the 180 degree phase shifter. The alternating PSM can further include an undercut or a bias in the 180 degree phase shifter. In an embodiment where a sub-resolution feature is formed in the 180 degree phase shifter, the blocker in the 0 degree phase shifter can be formed to be larger than the sub-resolution feature formed in the 180 degree phase shifter.

A computer-implemented system for generating an alternating PSM design is also provided. The system includes an input interface for receiving a layout and an output interface for outputting the alternating PSM design. The system further includes the means for converting the layout to the alternating PSM design. Notably, the means for converting includes software code for creating blockers in the 0 degree phase shifters, thereby minimizing an intensity imbalance with their corresponding 180 degree phase shifters.

The means for converting can further include software code for increasing a dimension of the blocker to improve the intensity imbalance, software code for creating a uniform intensity imbalance error on the PSM design using a plurality of blockers, and/or software code for performing optical proximity correction (OPC) on the PSM design. Note that OPC can be performed after or possibly even before incorporating the blockers in the PSM design.

DETAILED DESCRIPTION OF THE FIGURES

Figure 1A:
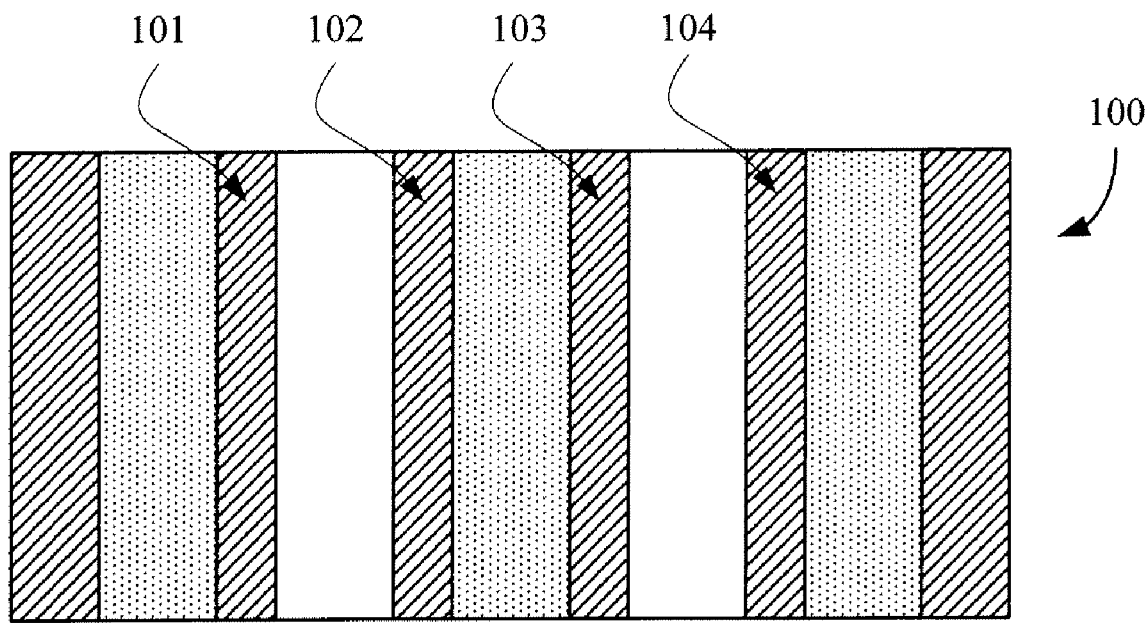
FIG. 1A illustrates a top view of an alternating PSM including closely spaced opaque features formed on a transparent substrate.
Figure 1B:
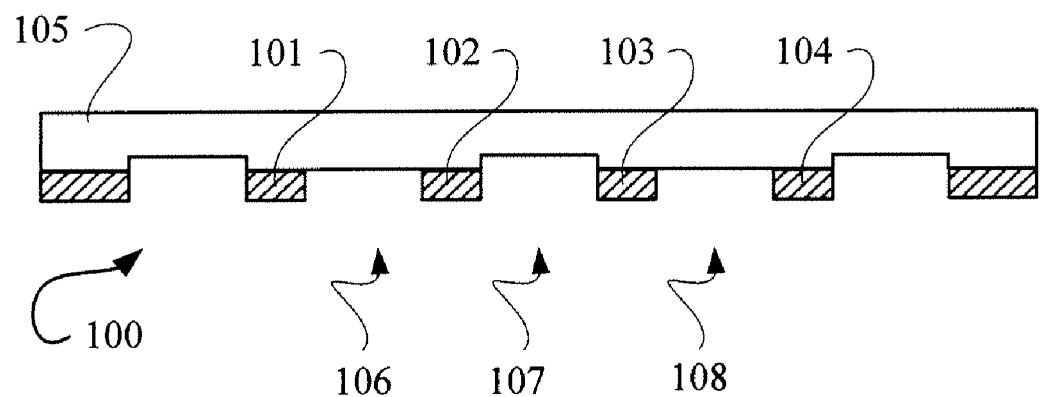
FIG. 1B illustrates a cross sectional view of the alternating PSM of FIG. 1A.
Figure 1C:
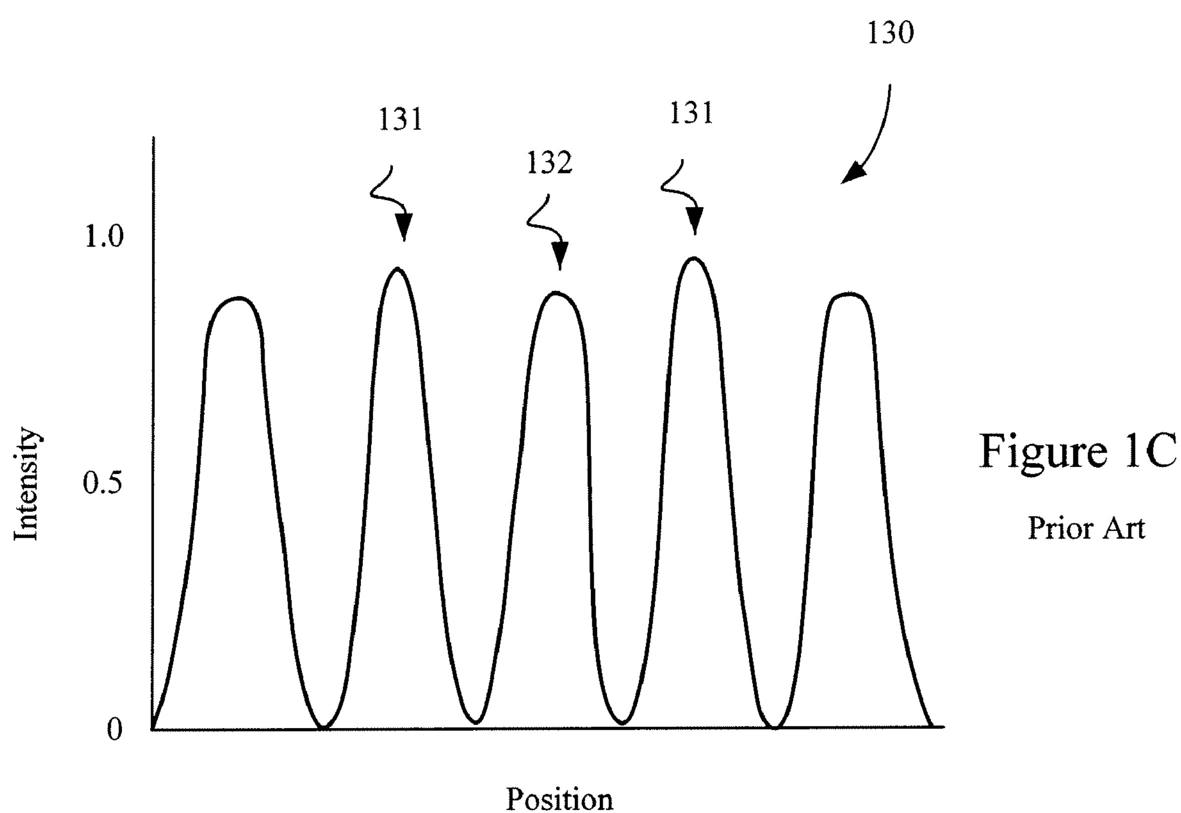
FIG. 1C illustrates a graph that plots intensity (0 to 1.0) versus position on the alternating PSM of FIGS. 1A and 1B.
Figure 1D:
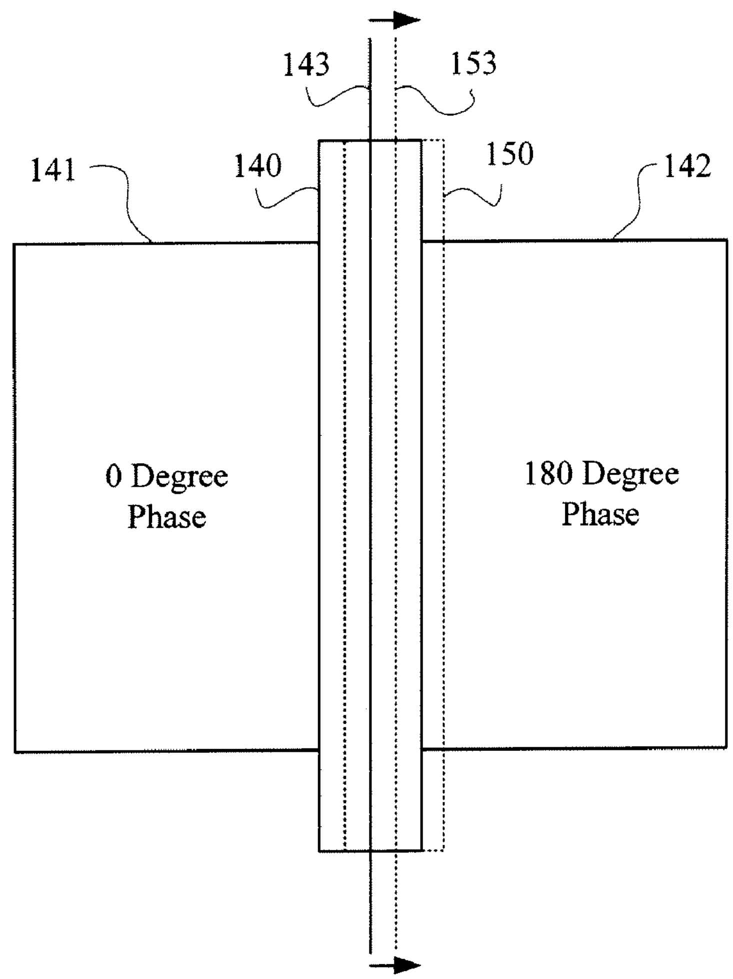
FIG. 1D illustrates a feature having a corresponding 0 degree phase-shifting region placed relative to one side of the feature and a corresponding 180 degree phase-shifting region placed relative to the other side of the feature.
Figure 1E:
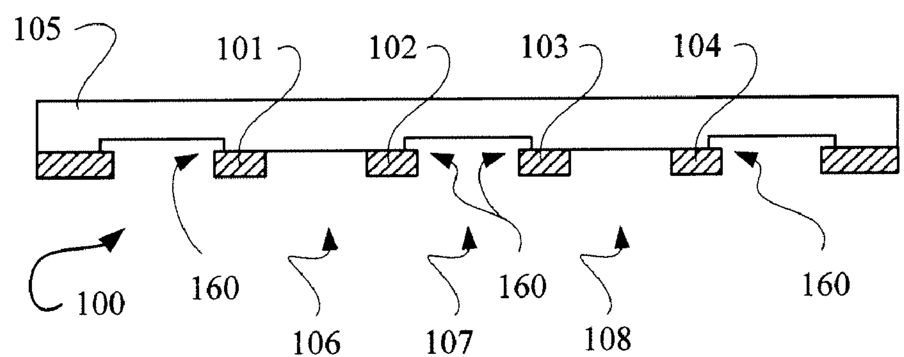
FIG. 1E illustrates a cross sectional view of an alternating PSM in which an additional etching step under-cuts certain features.
Figure 2:
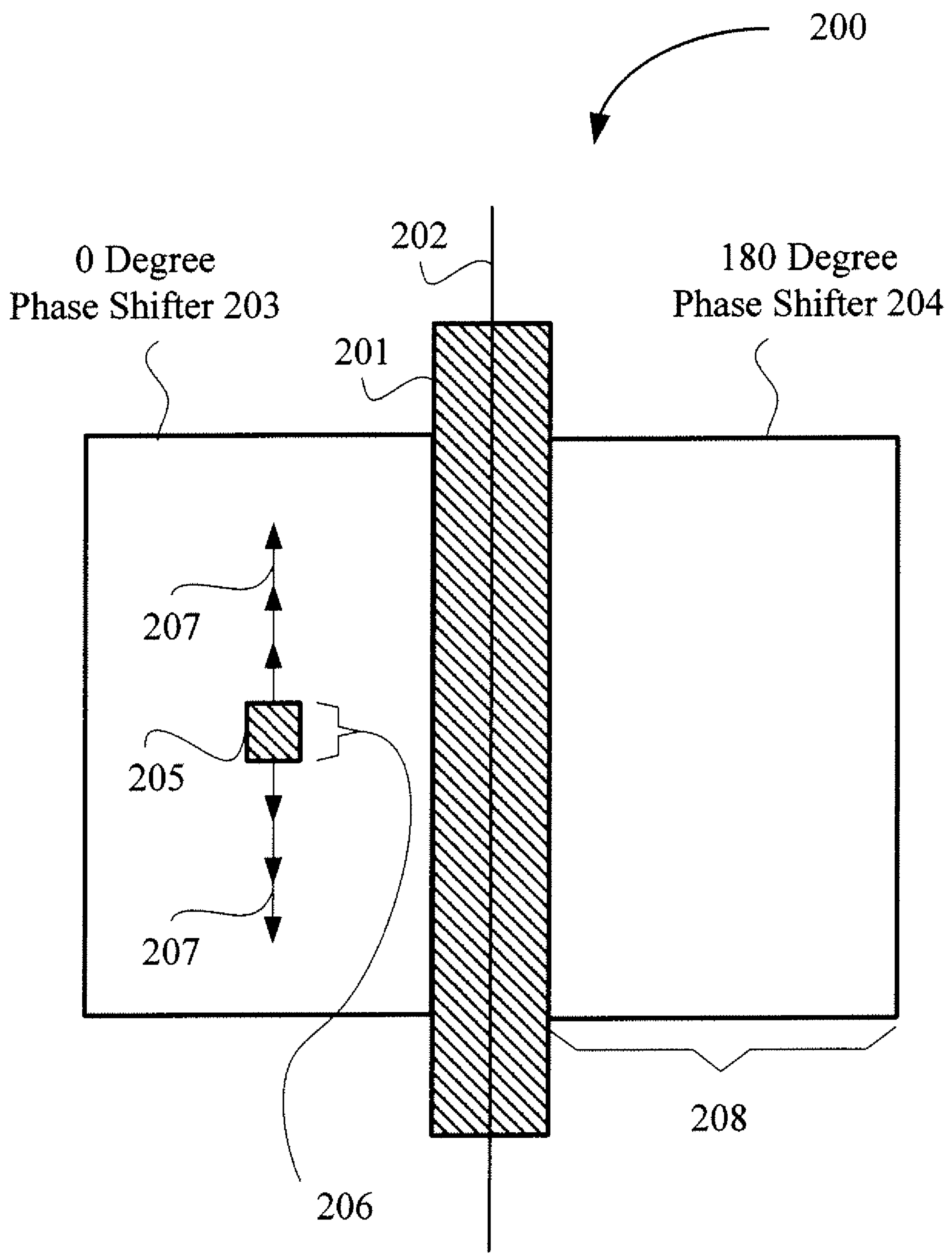
FIG. 2 illustrates a simplified alternating PSM layout including a 0 degree phase-shifting region and a corresponding 180 degree phase-shifting region usable for printing a feature (also shown for reference). To ensure that the feature prints on a wafer consistent with a desired centerline, a sub-resolution feature (called a "blocker" herein) can be positioned in the 0 degree phase-shifting region.

To correct 3D effects while ensuring mechanical stability and manufacturing efficiency, sub-resolution features can be placed within the 0 degree phase shifters of an alternating PSM, thereby substantially equalizing the intensity of the 0 degree and 180 degree phase shifters. For example, FIG. 2 illustrates a simplified alternating PSM layout 200. Layout 200 could be in, for example, a GDS-II format or any other format providing feature information regarding one or more layers of an integrated circuit. In this simplified layout, a 0 degree phase shifter 203 and an associated 180 degree phase shifter 204 can, when exposed, create a feature 201 (e.g. a transistor gate). To ensure that feature 201 prints on a wafer consistent with a centerline 202, a sub-resolution feature (hereinafter "blocker") 205 can be positioned in 0 degree phase shifter 203.

Of importance, sub-resolution features, such as blocker 205, will not print, i.e. resolve, on the wafer using standard PSM illumination conditions. PSM illumination conditions can include, for example, a numerical aperture (NA) of 0.7-0.9 and a partial coherence ($\sigma$) of 0.2-0.4. Advantageously, such PSM illumination conditions (particularly the lower $\sigma$ values) allow a relatively large margin for the sub-resolution width, thereby allowing substantial flexibility in achieving the desired degree of intensity imbalance correction.

In one embodiment, the blocker width can be fixed and a minimum blocker length 206 can be increased by predetermined increments (shown by arrows 207) until maximum intensity balance is achieved for a specific pair of phase shifters. For example, the width, minimum length, and predetermined increment could be set to 20 nm, wherein the original position of the blocker could be centered in the 0 degree phase shifter. In one embodiment, when the length of the blocker reaches 140 nm, the increment size can be increased to 40 nm. Logically, the length of the 0 degree phase shifter determines the maximum length of the blocker. In one embodiment, blocker 205 can be "grown" in 2× increments in two directions (e.g. one increment "up" and another increment "down"). In another embodiment, blocker 205 can be grown in single increments in a single direction determined by simulation results.

Figure 3:
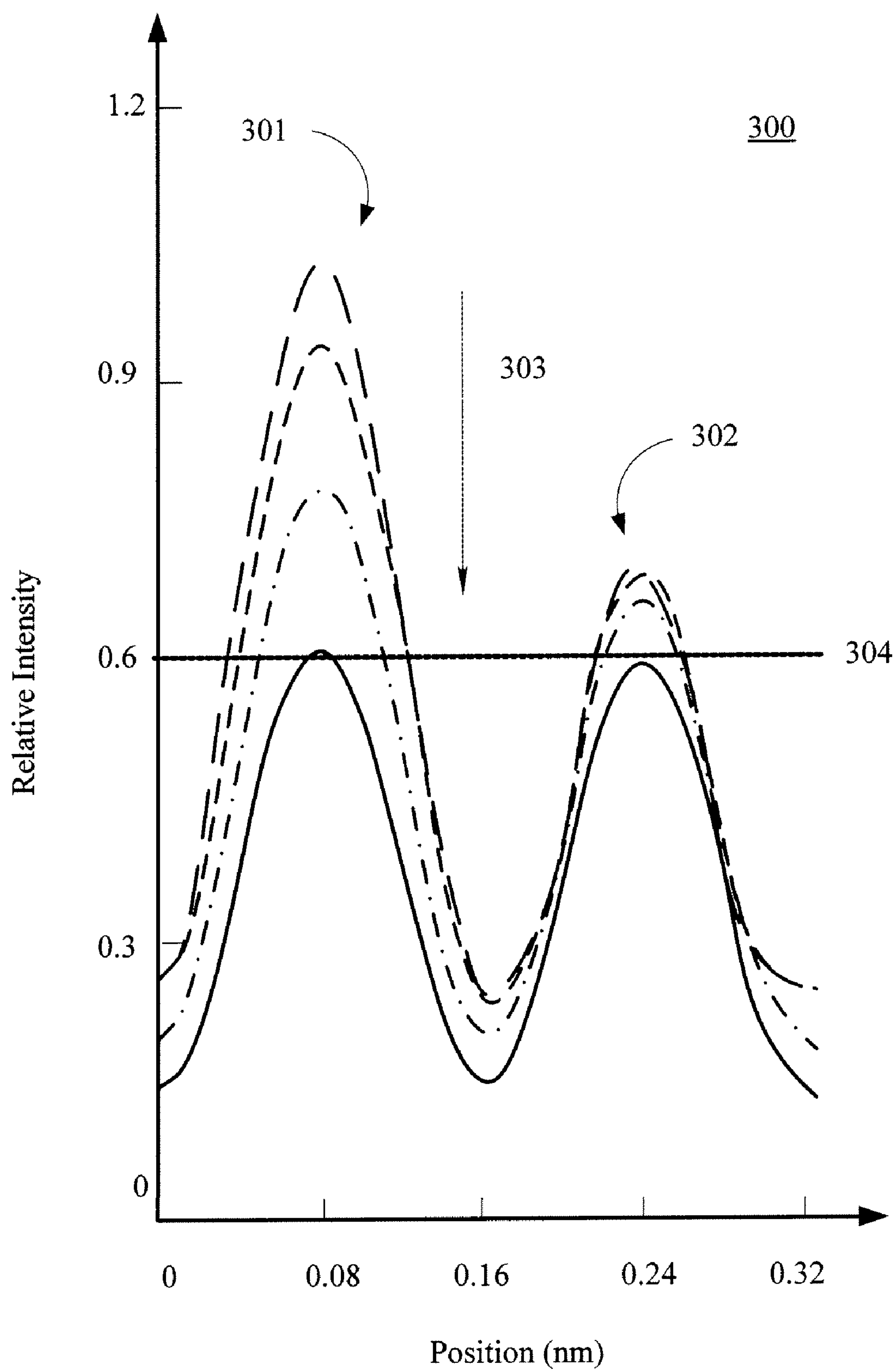
FIG. 3 illustrates a graph that plots relative intensity versus x-position for one pair of phase shifters. As shown in this graph, the relative intensity of the 0 degree phase shifter compared to the 180 degree phase shifter decreases as the length of a blocker increases.

FIG. 3 illustrates a graph 300 that plots relative intensity (y-axis) versus position (x-axis) for one pair of phase shifters. Specifically, curves 301 represent the relative intensities associated with a 0 degree phase shifter (e.g. phase shifter 203) and curves 302 represent the relative intensities associated with a 180 degree phase shifter (e.g. phase shifter 204). The relative intensity can be defined as a "slice" of the intensity that is computed parallel to the plane of the alternating PSM. An arrow 303 indicates that the relative intensity of the 0 degree phase shifter decreases as the length of a blocker increases (different blocker sizes are represented by different stipple patterns in graph 300). A line 304 indicates the point at which the block length (in this case, 250 nm) results in substantially equal relative intensity for both the 0 degree and 180 degree phase shifters. Of importance, while the maximum intensity decreases the minimum intensity also simultaneously decreases, thereby advantageously minimizing any loss in contrast.

One of the ways to characterize the intensity imbalance is to calculate the critical dimension (CD) difference or bias between the neighboring 0 degree and 180 degree phase shifters. Note that the term "space CD" in the context of phase shifters refers to the width of the phase shifter (e.g. width 208 of phase shifter 204). The difference between the CDs of a complementary pair of phase shifters, called the space CD bias herein, decreases as the intensity imbalance is being corrected with a blocker.

Figure 4A:
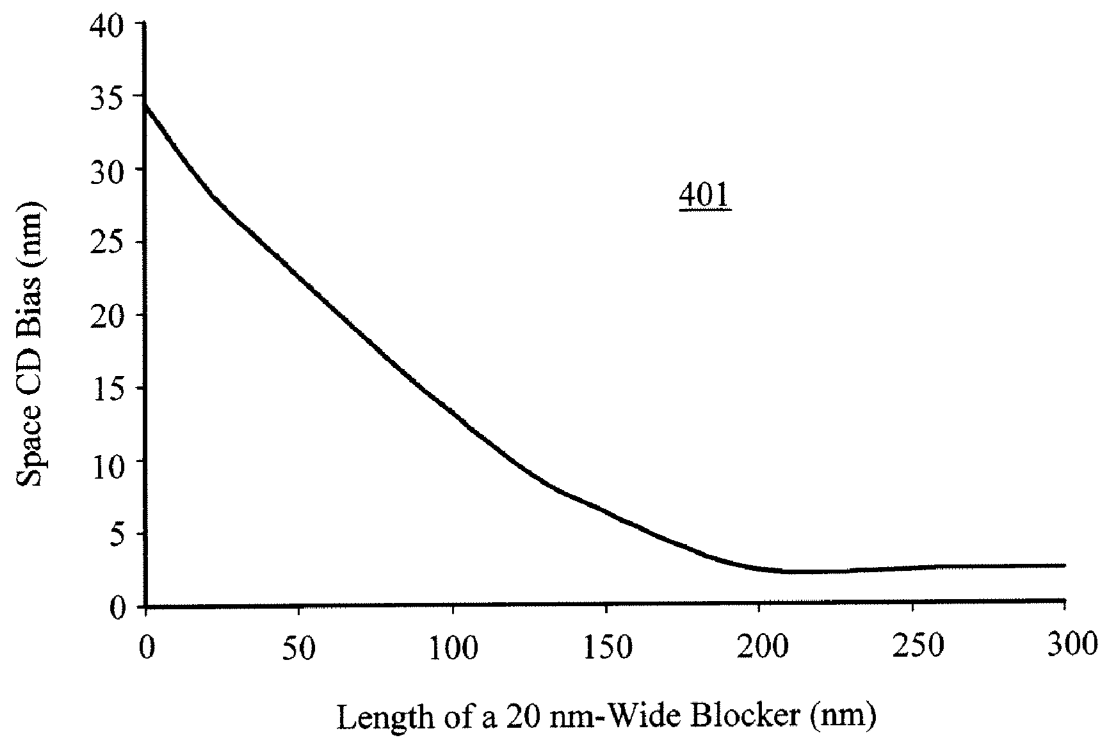
FIG. 4A illustrates a graph that depicts the rapid decrease of the space critical dimension (CD) bias as the length of a blocker increases.

For example, FIG. 4A illustrates a graph 401 that depicts the rapid decrease of the space CD bias as the length of a blocker increases. In the described exemplary blocker, which is 20 nm wide, the space CD bias converges to approximately 2 nm when the length of the blocker is approximately 200 nm. In one embodiment, the width of the blocker can be slightly increased to, for example, a width less than 50 nm (note that the upper limit of this width is functionally dependent on imaging conditions (e.g. NA, sigma, wavelength), but would still not result in a printable feature), thereby improving intensity balance and allowing the space-CD bias to converge to zero.

In general, intensity imbalance can persist through different defocus settings. Specifically, if the intensity imbalance is significant at nominal focus, significant deterioration would typically occur in the process latitude through focus. Advantageously, after correction with blockers, through focus improvement can be achieved.

Figure 4B:
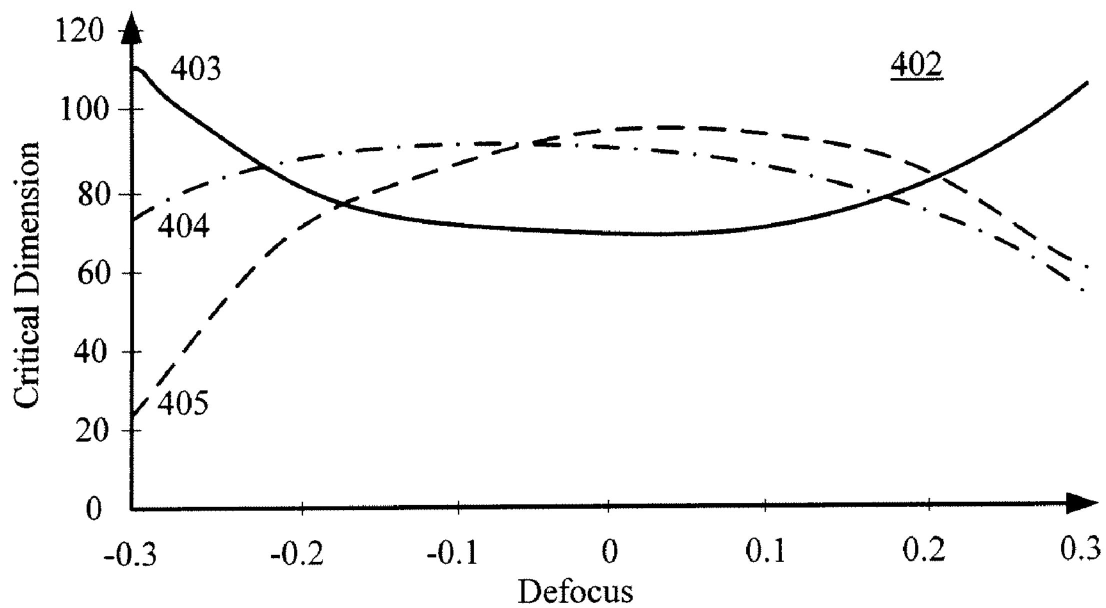
FIG. 4B illustrates a graph that plots a printed line CD curve, a 0 degree phase shifter CD curve, and a 180 degree phase shifter CD curve through a range of defocus settings.

For example, FIG. 4B illustrates a graph 402 that plots a printed line CD curve 403, a 0 degree phase shifter CD curve 404, and a 180 degree phase shifter CD curve 405 through defocus settings of −0.3 to 0.3. (Note that shifter CDs can vary due to 3D topography effects.) Notably, between defocus settings of −0.1 and 0.1, the printed line CD varies only by 2-3 nm and achieves its lowest CD values.

Figure 4C:
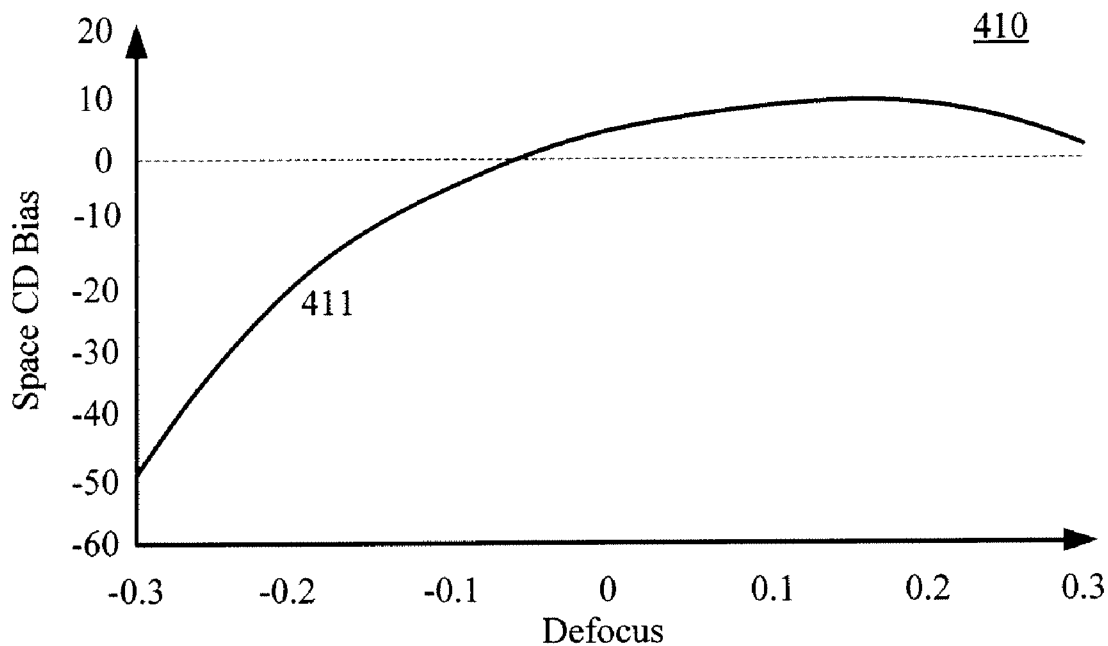
FIG. 4C illustrates a graph that plots a space CD bias curve through the same defocus settings of FIG. 4B. As shown by FIGS. 4A-4C, when using blockers, through focus and printed line CD variation are within acceptable limits, thereby providing satisfactory process latitude.

FIG. 4C illustrates a graph 410 that plots a space CD bias curve 411 through these same defocus settings (i.e. of −0.3 to 0.3). Note that between defocus settings of −0.1 and 0.1, the intensity is balanced (as evidenced by the relative space CD bias being +/−10 nm). Thus, when using blockers, through focus and printed line CD variation are within acceptable limits, thereby providing satisfactory process latitude.

Figure 4D:
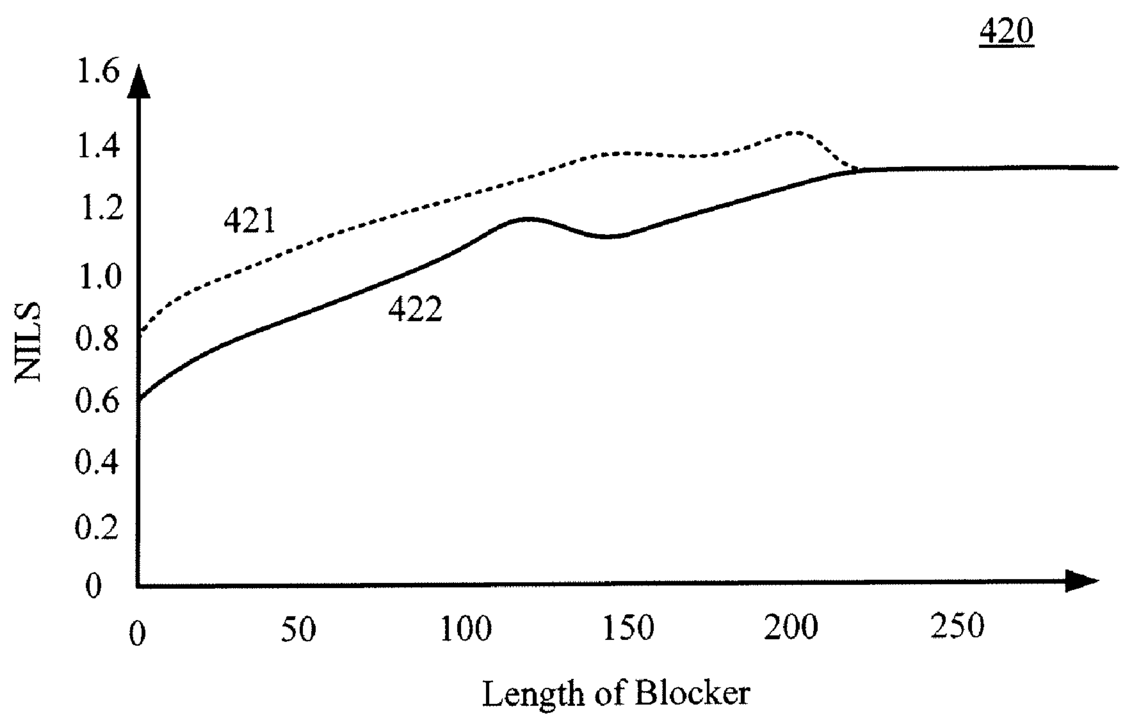
FIG. 4D illustrates a graph showing that the normalized image log slope (NILS) on either side of the intensity profile does not exhibit any substantial deterioration as intensity balance is achieved.

To verify that the image quality is maintained, a normalized image log slope (NILS) can be measured. FIG. 4D shows a graph 420 demonstrating that the NILS on either side of the intensity profile (shown by 0 degree phase shifter NILS curve 421 and 180 degree phase shifter NILS curve 422) do not exhibit any substantial deterioration as intensity balance is achieved. In fact, there is an increase in the NILS associated with both curves 421 and 422, which indicates that blockers could actually enhance the image quality.

At the 65 nm technology node and below, intensity imbalance could pose additional challenges and therefore may require supplemental correction techniques. The use of blockers within the 0 degree phase shifters can be easily incorporated into such multi-faceted approaches while minimizing PSM manufacturing complexity.

Figure 5A:
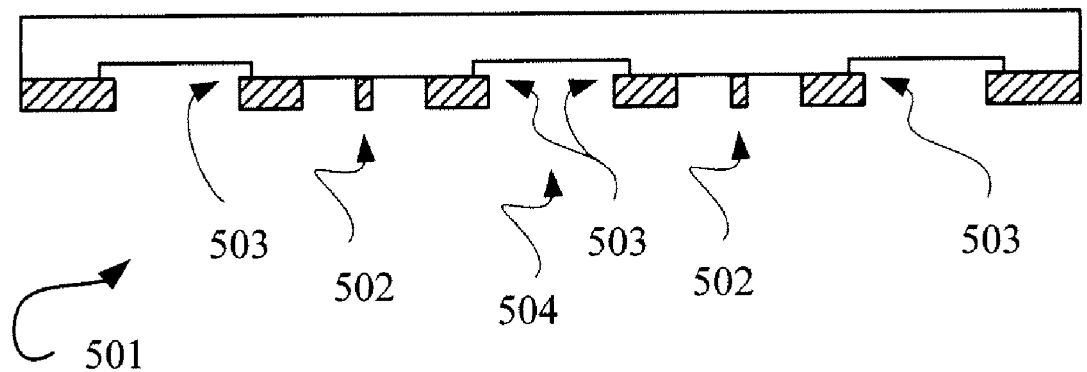
FIGS. 5A-5C illustrate cross sectional views of exemplary alternating PSMs using blockers with other techniques to resolve intensity imbalance.
Figure 5B:
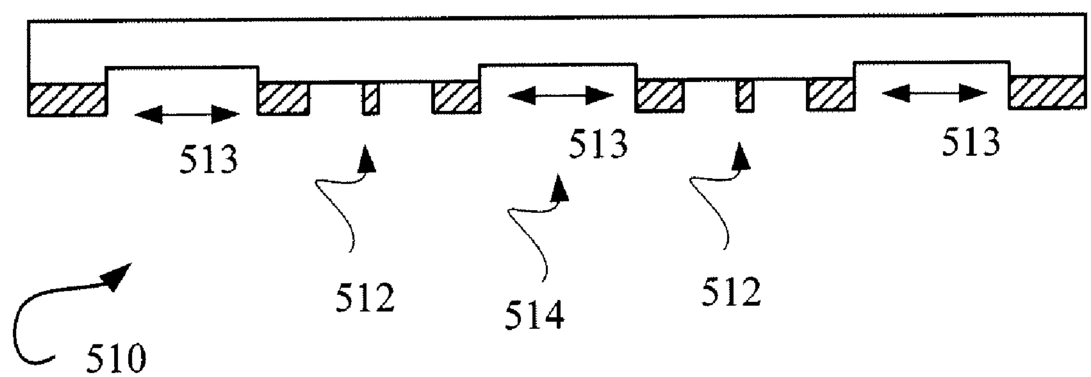
Figure 5C:
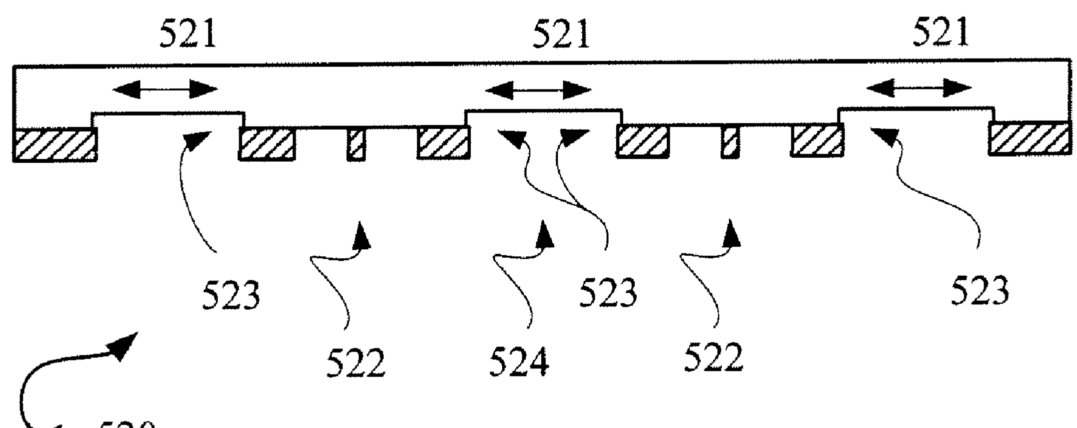

FIGS. 5A-5C illustrate cross-sectional views of exemplary alternating PSMs using blockers with other techniques to resolve intensity imbalance. For example, FIG. 5A illustrates an alternating PSM mask 501 that includes blockers 502 as well as undercuts 503 in the 180 degree phase shifters 504. FIG. 5B illustrates an alternating PSM mask 510 that includes blockers 512 as well as biasing 513 for the 180 degree phase shifters 514. FIG. 5C illustrates an alternating PSM mask 520 that includes blockers 522 as well as undercuts 523 in and biasing 521 for the 180 degree phase shifters 524.

Note that minimal undercutting in 180 degree phase shifting regions may be desirably created in some standard PSM manufacturing processes. Specifically, in a typical etching process for the 180 degree phase shifters of an alternating PSM, two etches are performed. The first etch is an anisotropic etch that provides a substantially vertical profile. However, this anisotropic etch can result in some jagged edges in the formed trench. Therefore, the second etch is an isotropic etch that planarizes those jagged edges. Notably, this isotropic etch results in undercut profiles for the 180 degree phase shifters.

Therefore, in one embodiment, the amount of undercutting can be advantageously limited to that necessary to form a "clean" alternating PSM having minimal jagged edges in its trenches while at the same time providing some minimal intensity imbalance correction. That is, the blockers can correct for the majority of the intensity imbalance created by the 0 degree and 180 degree phase shifters and generate a uniform intensity imbalance error across the PSM. In this case, the undercutting resulting from the second etch can supplement the intensity imbalance correction provided by the blockers. Specifically, the second etch can now be performed globally on the alternating PSM to exactly correct for the remaining (now uniform) intensity imbalance. Therefore, blockers can eliminate the overcompensation for intensity imbalance present in prior art mask-based solutions. Moreover, because undercutting is minimal, mechanical stability of the patterned chrome on the PSM is improved.

Advantageously, blockers can be easily incorporated into a standard PSM manufacturing process. Specifically, blockers can be formed in the opaque (e.g. chrome) layer at the same time as other opaque features. Therefore, blockers ensure that manufacturing resources are efficiently used.

Figure 6:
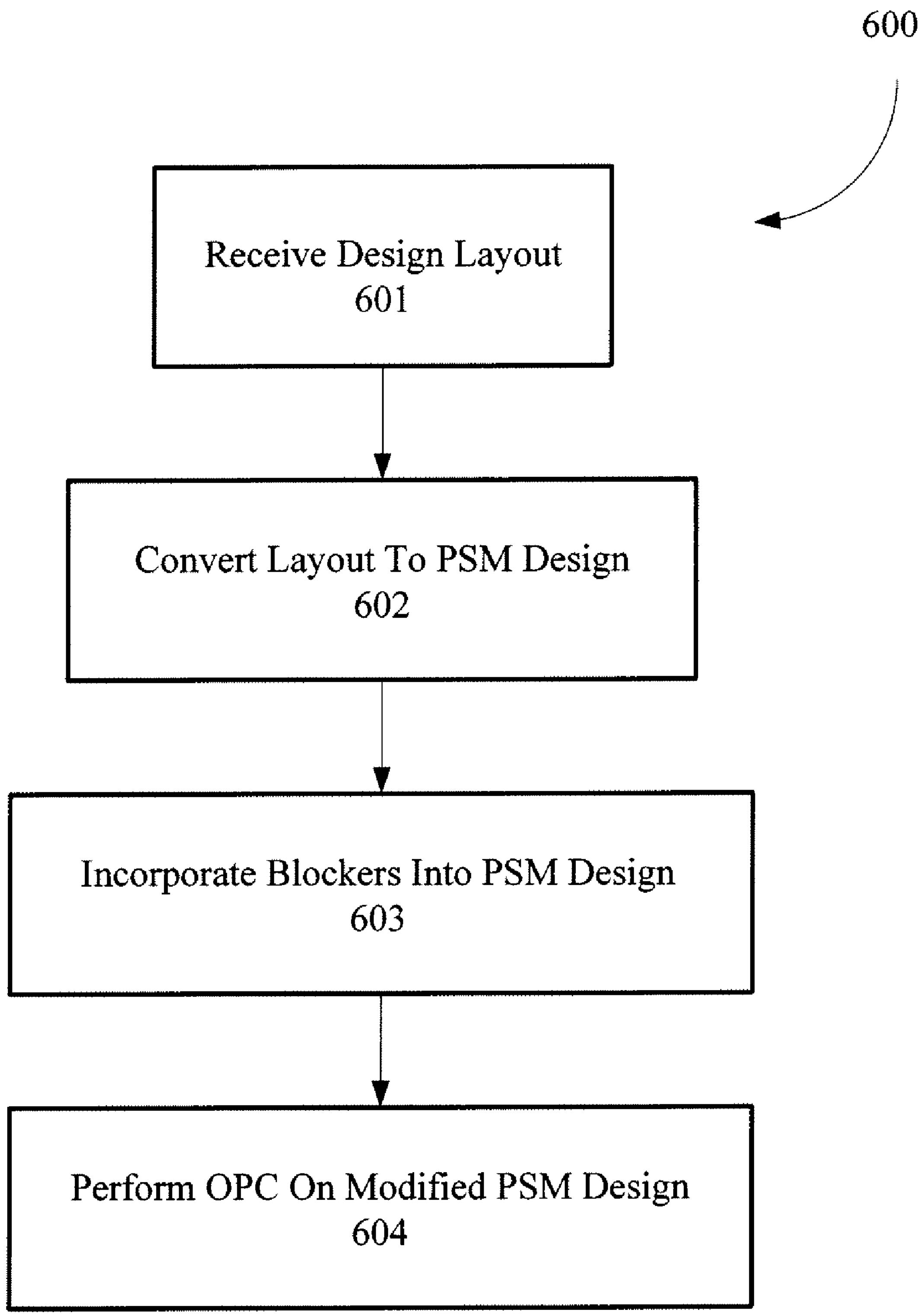
FIG. 6 illustrates an alternating PSM design flow implementable using software. In this flow, blockers can be used, as necessary, to minimize intensity imbalance in the alternating PSM design.

Notably, the size, number of, or even the need for blockers can be easily determined for each printable feature. For example, FIG. 6 illustrates an alternating PSM design flow 600 implementable using software. In flow 600, a desired layout can be received in step 601. In step 602, the desired layout can be converted into an alternating PSM design. At this point, blockers can be incorporated into the alternating PSM design, as necessary, in step 603. Note that blocker incorporation can be rule-based and/or determined by simulation. In step 604, optical proximity correction (OPC) can be performed on the alternating PSM design including blockers, thereby facilitating a "fine tuning" of the alternating PSM design and even of the blockers themselves. In one embodiment, steps 603 and 604 can be switched, i.e. blockers can be incorporated into the alternating PSM design first corrected for OPC. In another embodiment, steps 603 and 604 can be combined into a single step in which model-based simulation can determine both OPC corrections and blocker inclusion for the alternating PSM design. Note that other corrections can be performed as part of OPC, e.g. microloading corrections etc., can be performed after step 604. Microloading corrections are described in U.S. patent application Ser. No. 09/945,012, which was filed on Aug. 31, 2001, published as US Patent Publication 2003/0046653 A1, by the assignee of the present application, Numerical Technologies, Inc. In one embodiment, corrections to the alternating PSM design can be performed in an order dependent on impact on printability, wherein the correction having the most impact on printability could be performed first.

In some embodiments the iN-Phase® software and/or the Proteus™ software from the parent corporation of Numerical Technologies, Inc., Synopsys, Inc., can be suitably modified to support the steps of process 600. For example, as part of step 602, the iN-Phase® software can read in a GDS-II layout and convert such a layout to a PSM design. Similarly, the Proteus™ software could be used at step 604. Either tool, when appropriately modified, or a separate tool could perform step 603.

Figure 7:
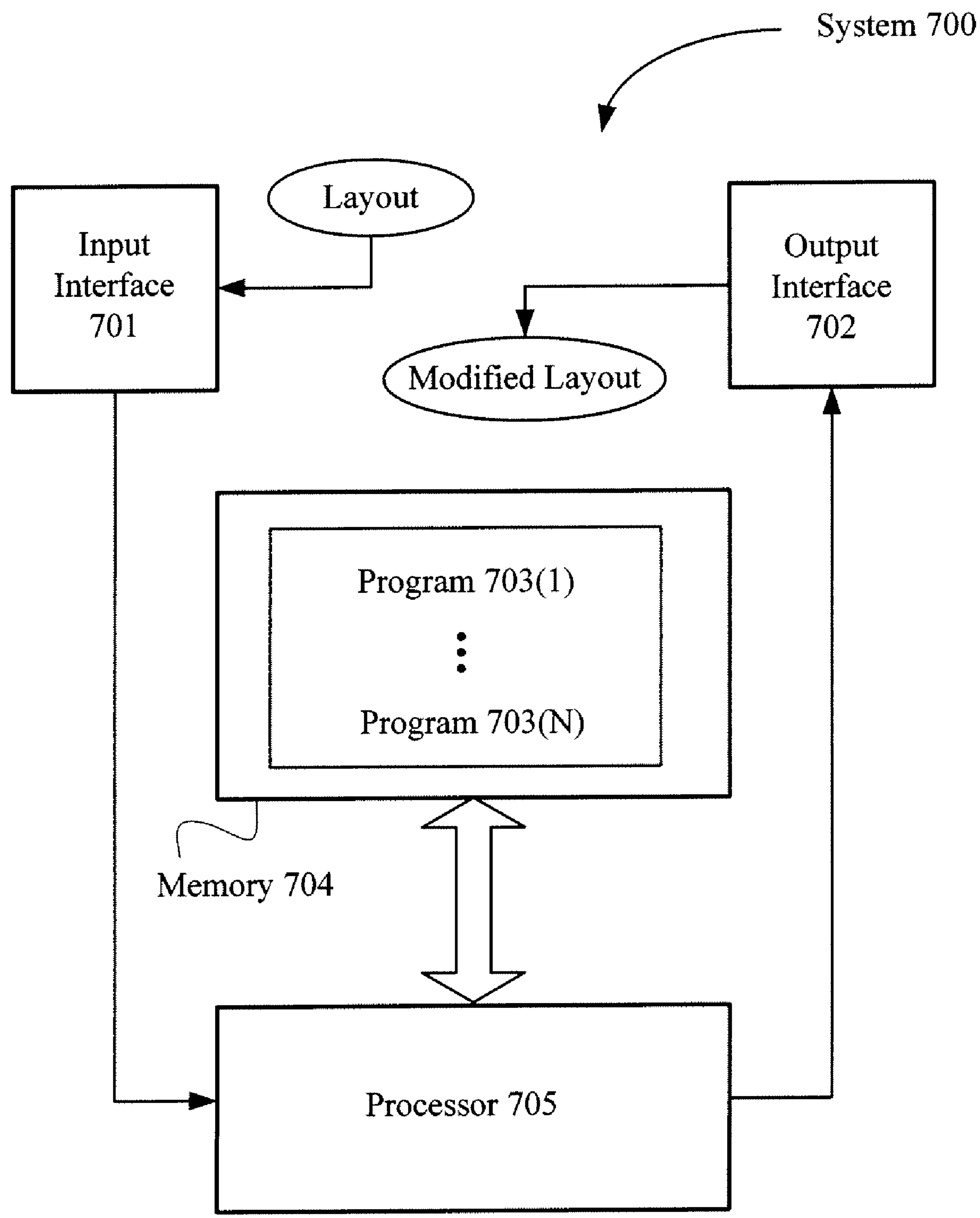
FIG. 7 illustrates a system that can compensate for 3D effects on an alternating PSM.

FIG. 7 illustrates a system 700 that can compensate for 3D effects on an alternating PSM. In one embodiment, system 700 can include an input interface 701 for receiving a layout and an output interface 702 for providing a modified layout that includes blockers. System 700 can also include a memory 704 that stores a plurality of computer-implemented programs 703(1)-703(N) for implementing the steps described in reference to FIG. 6 (e.g. layout conversion, blocker incorporation, OPC, etc.). In a typical embodiment, system 700 can further include a processor 705 for executing computer-implemented programs 703.

Note that computer-implemented programs 703 can be run on any number of computer platforms including: a PC using a UNIX®-like operating system with suitable memory and processor speeds, either stand alone or connected to a network, and a SUN™ workstation computer among others. In one embodiment, computer-implemented programs 703 include the EM-Suite™ simulation program from Panoramic Technology that is based on the finite-difference-time-domain algorithm TEMPEST. In another embodiment, computer-implemented programs 703 can include any software capable of solving rigorous Maxwell equations, thereby able to accurately take into account the depth of the substrate and diffraction effects within the substrate (i.e. 3D effects).

Figure 8:
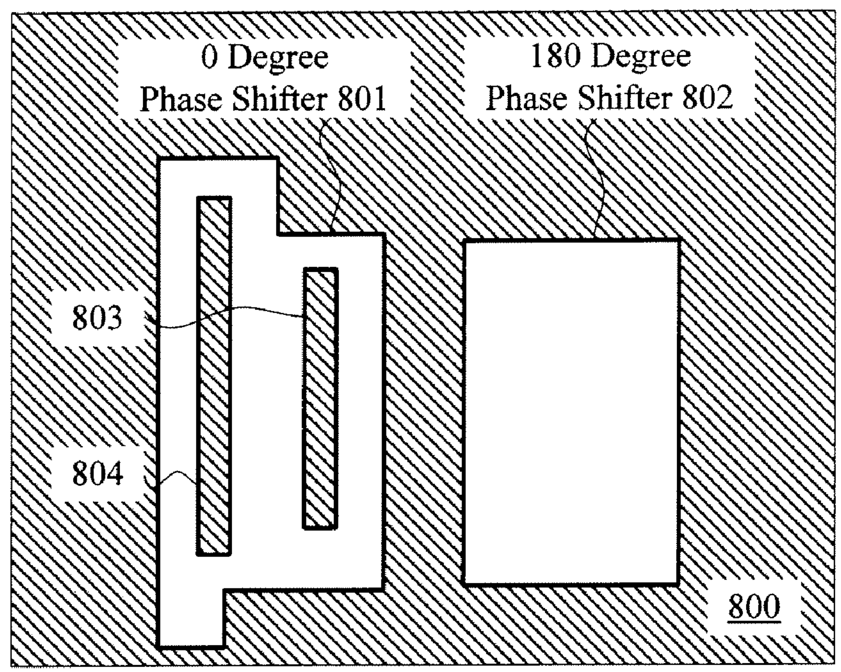
FIG. 8 illustrates an exemplary alternating PSM that can include a plurality of blockers within a 0 degree phase shifter.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, FIG. 8 illustrates an alternating PSM 800 that includes a 0 degree phase shifter 801 that is significantly larger than its corresponding 180 degree phase shifter 802. In this configuration, to more completely correct for intensity imbalance, a plurality of blockers (e.g. blockers 803 and 804) can be placed within 0 degree phase shifter 801.

Note that placing identical sub-resolution features within both the 0 degree and 180 degree shifters is taught by U.S. Pat. No. 6,541,165, which issued on Apr. 1, 2003 to the assignee of the present application, Numerical Technologies, Inc., to improve the straightness and uniformity of the resulting printed lines. In contrast, the blockers described herein address the problem of intensity imbalance.

Figure 9:
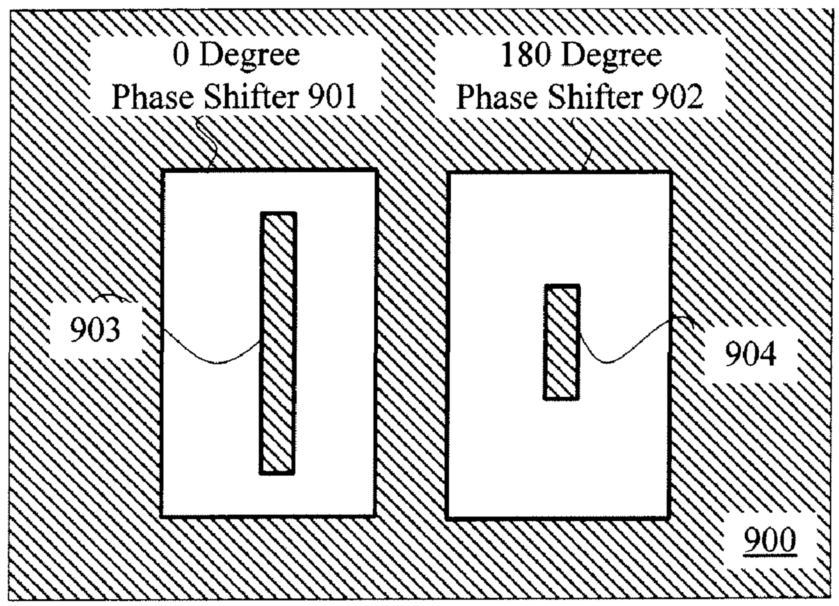
FIG. 9 illustrates an exemplary alternating PSM that may significantly improve the intensity imbalance between corresponding phase shifters as well as the straightness/uniformity of the resulting printed feature.

Therefore, in another embodiment shown in FIG. 9, an exemplary alternating PSM 900 can include sub-resolution features placed in both the 0 degree and 180 degree phase shifters to address intensity imbalance as well as straightness/uniformity. Specifically, alternating PSM 900 can include a blocker 903 in a 0 degree shifter 901 that is sized larger than a sub-resolution feature 904 in a 180 degree phase shifter 902. In this manner, the intensity imbalance between the two shifters as well as the straightness/uniformity of the resulting printed lines can be significantly improved.

In yet another embodiment, because of the inclusion of blockers, the 0 degree phase shifters may be sized larger than the 180 degree phase shifters during PSM conversion (e.g. step 602 of FIG. 6). In this manner, the size of the blocker may be increased enough to improve intensity imbalance while still remaining a sub-resolution feature.

Note that although 0 degree phase shifters and 180 degree phase shifters are discussed herein, blockers can be used with other phase shifter pairs having a phase shift differential of approximately 180 degrees (e.g. 10 degree phase shifters and 190 degree phase shifters). Therefore, the designation herein of a 0 degree or a 180 degree phase shifter is merely indicative of the phase shift between a pair of shifters and is not limiting.

Note that the methods described herein can be applied to a variety of lithographic process technologies, including ultraviolet, deep ultraviolet (DUV), extreme ultraviolet (EUV), and x-ray. Accordingly, it is intended that the scope of the invention be defined by the following Claims and their equivalents.

The invention claimed is:

1. A method of designing an alternating phase shifting mask (PSM), the method comprising:

converting a layout to an alternating PSM design including first phase shifters and second phase shifters, the first phase shifters being close to 0 degrees and the second phase shifters being close to 180 degrees; and using a processor, incorporating first sub-resolution features in the alternating PSM design, wherein a first sub-resolution feature is formed in a first phase shifter to minimize an intensity imbalance with a corresponding second phase shifter.

2. The method of claim 1, wherein incorporating first sub-resolution features includes growing a length of the first sub-resolution feature.

3. The method of claim 1, wherein incorporating first sub-resolution features includes forming a plurality of first sub-resolution features in the first phase shifter.

4. The method of claim 1, wherein if a second phase shifter includes a sub-resolution feature, then sizing the first sub-resolution feature in the first phase shifter to be larger than the sub-resolution feature.

5. The method of claim 1, wherein incorporating first sub-resolution features creates a substantially uniform intensity imbalance error on the alternating PSM.

6. The method of claim 1, further including performing optical proximity correction (OPC) on the alternating PSM design.

7. The method of claim 6, wherein performing OPC is done after incorporating first sub-resolution features in the alternating PSM design.

8. The method of claim 6, wherein performing OPC is done before incorporating first sub-resolution features in the alternating PSM design.

9. A method of generating an alternating phase shifting mask (PSM) design including first phase shifters and second phase shifters, the method comprising:

minimizing an intensity imbalance between a first phase shifter and a second phase shifter corresponding to the first phase shifter by incorporating a first sub-resolution feature in the first phase shifter, the first phase shifter being close to 0 degrees and the second phase shifter being close to 180 degrees.

10. The method of claim 9, wherein incorporating the first sub-resolution feature includes growing a single dimension of the first sub-resolution feature.

11. The method of claim 9, wherein incorporating the first sub-resolution feature includes forming a plurality of sub-resolution features in the first phase shifter.

12. The method of claim 9, wherein if the second phase shifter includes a second sub-resolution feature, then sizing the first sub-resolution feature to be larger than the second sub-resolution feature.

13. The method of claim 9, wherein incorporating the first sub-resolution feature for each first phase shifter and second phase shifter of the alternating PSM creates a substantially uniform intensity imbalance error on the alternating PSM.

14. The method of claim 9, further including performing optical proximity correction (OPC) on the alternating PSM design.

15. The method of claim 14, wherein performing OPC is done after minimizing the intensity imbalance.

16. The method of claim 14, wherein performing OPC is done before minimizing the intensity imbalance.

17. An alternating phase shifting mask (PSM) comprising:

a first phase shifter;

a second phase shifter corresponding to the first phase shifter; and at least one sub-resolution feature formed in the first phase shifter to minimize an intensity imbalance with the second phase shifter, the first phase shifter being close to 0 degrees and the second phase shifter being close to 180 degrees.

18. The alternating PSM of claim 17, further including an undercut in the second phase shifter.

19. The alternating PSM of claim 17, further including a bias in the second phase shifter.

20. The alternating PSM of claim 17, further including a sub-resolution feature formed in the second phase shifter, wherein the sub-resolution feature formed in the first phase shifter is larger than the sub-resolution feature formed in the second phase shifter.

21. A computer-implemented system for generating an alternating phase shifting mask (PSM) design, the alternating PSM design including first phase shifters and second phase shifters, the system comprising:

an input interface for receiving a layout;

means for converting the layout to the alternating PSM design, wherein the alternating PSM design includes a first sub-resolution feature formed in a first phase shifter to minimize an intensity imbalance with a corresponding second phase shifter, the first phase shifters being close to 0 degrees and the second phase shifters being close to 180 degrees; and an output interface for outputting the alternating PSM design.

22. The computer-implemented system of claim 21, wherein the means for converting includes software code for increasing a dimension of the first sub-resolution feature to improve the intensity imbalance.

23. The computer-implemented system of claim 21, wherein the means for converting includes software code for creating a uniform intensity imbalance error on the alternating PSM using a plurality of first sub-resolution features.

24. The computer-implemented system of claim 21, wherein the means for converting includes software code for performing optical proximity correction (OPC) on the alternating PSM design.

25. A method of manufacturing an alternating phase shifting mask (PSM), the method comprising:

using a software-implemented technique to create a uniform intensity imbalance error on the alternating PSM, the software-implemented technique including incorporating blockers in an alternating PSM design, wherein a blocker is formed in a first phase shifter to minimize an intensity imbalance with a second phase shifter corresponding to the first phase shifter, the first phase shifter being close to 0 degrees and the second phase shifter being close to 180 degrees; and using a mask-implemented technique to correct for the uniform intensity imbalance error on the alternating PSM.

26. The method of claim 25, wherein incorporating blockers includes growing a length of the blocker.

27. The method of claim 25, wherein incorporating blockers includes forming a plurality of blockers in the first phase shifter.

28. The method of claim 25, wherein if a second phase shifter includes a sub-resolution feature, then sizing the blocker in the first phase shifter to be larger than the sub-resolution feature.

29. The method of claim 25, wherein incorporating blockers creates a substantially uniform intensity imbalance error on the alternating PSM.

30. The method of claim 25, wherein the software-implemented technique further includes:

performing optical proximity correction (OPC) on the alternating PSM design.

31. The method of claim 30, wherein performing OPC is done after incorporating blockers in the alternating PSM design.

32. The method of claim 30, wherein performing OPC is done before incorporating blockers in the alternating PSM design.

33. The method of claim 25, wherein the mask-implemented technique includes:

undercutting the second phase shifter.

34. The method of claim 25, wherein the mask-implemented technique includes:

biasing the second phase shifter.

35. A method of manufacturing an alternating phase shifting mask (PSM), the method comprising:

using a software-implemented technique to create a uniform intensity imbalance error on the alternating PSM, the software-implemented technique including incorporating first sub-resolution features in an alternating PSM design, wherein a first sub-resolution feature is formed in a first phase shifter to minimize an intensity imbalance with a second phase shifter corresponding to the first phase shifter, the first phase shifter being close to 0 degrees and the second phase shifter being close to 180 degrees; and using a mask-implemented technique to correct for the uniform intensity imbalance error on the alternating PSM.

36. The method of claim 35, wherein incorporating first sub-resolution features includes growing a single dimension of the first sub-resolution feature.

37. The method of claim 35, wherein incorporating first sub-resolution features includes forming a plurality of first sub-resolution features in the first phase shifter.

38. The method of claim 35, wherein if the second phase shifter includes a second sub-resolution feature, then sizing the first sub-resolution feature to be larger than the second sub-resolution feature.

39. The method of claim 35, wherein incorporating the first sub-resolution feature for each first phase shifter and second phase shifter of the alternating PSM creates a substantially uniform intensity imbalance error on the alternating PSM.

40. The method of claim 35, wherein the software-implemented technique further includes:

performing optical proximity correction (OPC) on the alternating PSM design.

41. The method of claim 40, wherein performing OPC is done after minimizing intensity imbalance.

42. The method of claim 40, wherein performing OPC is done before minimizing intensity imbalance.

43. The method of claim 35, wherein the mask-implemented technique includes undercutting the second phase shifter.

44. The method of claim 35, wherein the mask-implemented technique includes biasing the second phase shifter.

* * * * *

UNITED STATES PATENT AND TRADEMARK OFFICE

CERTIFICATE OF CORRECTION

PATENT NO. : 8,032,845 B2
APPLICATION NO. : 12/360694
DATED : October 4, 2011
INVENTOR(S) : Kamat et al.

It is certified that error appears in the above-identified patent and that said Letters Patent is hereby corrected as shown below:

In the Claims

Column 9

Line 46, Claim 2, insert --said-- before "incorporating".
Line 49, Claim 3, insert --said-- before "incorporating".
Line 56, Claim 5, insert --said-- before "incorporating".
Line 62, Claim 7, insert --said-- before "performing".
Line 65, Claim 8, insert --said-- before "performing".

Column 10

Line 28, Claim 15, insert --said-- before "performing".
Line 30, Claim 16, insert --said-- before "performing".
Line 47, Claim 20, insert --at least one-- before "sub-resolution".

Column 11

Line 23, Claim 26, insert --said-- before "incorporating".
Line 25, Claim 27, insert --said-- before "incorporating".
Line 28, Claim 28, amend "a" to --the--.
Line 32, Claim 29, insert --said-- before "incorporating".
Line 39, Claim 31, insert --said-- before "performing".
Line 40, Claim 31, insert --said-- before "incorporating".
Line 42, Claim 32, insert --said-- before "performing".
Line 43, Claim 32, insert --said-- before "incorporating".

Column 12

Line 19, Claim 36, insert --said-- before "incorporating".
Line 22, Claim 37, insert --said-- before "incorporating".
Line 37, Claim 41, insert --said-- before "performing".

Signed and Sealed this
Eighteenth Day of February, 2014

Michelle K. Lee
*Deputy Director of the United States Patent and Trademark Office*

Line 38, Claim 41, insert --the-- before “intensity”.
Line 39, Claim 42, insert --said-- before “performing”.
Line 40, Claim 42, insert --the-- before “intensity”.